(12) United States Patent
Mochida et al.

(10) Patent No.: US 7,172,469 B2
(45) Date of Patent: Feb. 6, 2007

(54) STRUCTURE OF BONDING PLASTIC PART INSERT-MOLDED WITH WIRING BOARD AND METHOD OF BONDING THE SAME

(75) Inventors: Haruo Mochida, Kanagawa (JP);
Shingo Goto, Kanagawa (JP);
Masakazu Akahori, Kanagawa (JP);
Yoshio Itabashi, Ibaraki-ken (JP);
Katsumi Uraguchi, Ibaraki-ken (JP);
Tsugio Nakata, Ibaraki-ken (JP)

(73) Assignees: OHI Seisakusho Co., Ltd., Yokohama (JP); Jonan Industrial Co., Ltd., Inashiki (JP)

( * ) Notice: Subject to any disclaimer, the term of this patent is extended or adjusted under 35 U.S.C. 154(b) by 375 days.

(21) Appl. No.: 10/660,739

(22) Filed: Sep. 12, 2003

(65) Prior Publication Data

US 2004/0123947 A1 Jul. 1, 2004

(30) Foreign Application Priority Data

Sep. 12, 2002 (JP) ............................. P2002-266903

(51) Int. Cl.
*H01R 13/405* (2006.01)

(52) U.S. Cl. ...................................... 439/736; 439/76.1
(58) Field of Classification Search ................ 439/736, 439/76.1, 874
See application file for complete search history.

(56) References Cited

U.S. PATENT DOCUMENTS 5,452,948 A * 9/1995 Cooper et al. ............ 303/119.3
5,766,026 A * 6/1998 Cooper et al. ............. 439/76.1
6,068,523 A * 5/2000 Takahashi .................... 439/736

FOREIGN PATENT DOCUMENTS

JP         2002-129803 A        5/2002

* cited by examiner

*Primary Examiner*—Briggitte R. Hammond
(74) *Attorney, Agent, or Firm*—Foley & Lardner LLP

(57) ABSTRACT

In insert-molding a wiring board, at either one of a surrounding of a holding hole of the wiring board provided at a first plastic part and a second plastic part opposed thereto, a hole side projected portion capable of being brought into contact with a bonding face of other thereof is provided, and the surrounding of the holding hole in the first plastic part and the second plastic part are bonded to each other by melting the hole side projected portion by applying ultrasonic wave to bonding portions of the two plastic parts.

13 Claims, 8 Drawing Sheets

STRUCTURE OF BONDING PLASTIC PART INSERT-MOLDED WITH WIRING BOARD AND METHOD OF BONDING THE SAME

The present application is based on Japanese Patent Application No. 2002-266903, the entire contents of which are incorporated herein by reference.

BACKGROUND OF THE INVENTION

1. Field of the Invention

The present invention relates to a structure of bonding a plastic part insert-molded with a wiring board and a method of bonding the same.

2. Related Art

Conventionally, in a constitution in which a first plastic part insert-molded with a wiring board continuous to a connection terminal is integrated to a second plastic part installed with an electrical equipment, the first plastic part is fixed to the second plastic part by providing a fitting projection at the second plastic part (a case of a door latch actuator mounted to inside of a door of a vehicle) and fitting the first plastic part (board) to the fitting projection (for example, refer to Japanese Patent Publication No. JP-A-2002-129803)

However, according to the above-described conventional structure, a connection terminal emerging from the first plastic part is introduced into a connection terminal introducing hole provided at the second plastic part and projected to an outer side of the second plastic part and therefore, there is a concern of bringing about electric failure since rain water or the like invading a clearance between the connection terminal and the connection terminal introducing hole is adhered to the electrical equipment arranged at the second plastic part.

Further, the first plastic part is formed with a holding hole by which a portion of the wiring board is exposed by presence of a holding piece for supporting the wiring board at a space of a die for insert-molding when the wiring board is insert-molded. Therefore, there is a concern that rain water or the like invades the holding hole, the invading rain water or the like is adhered to the wiring board to bring about electric failure.

SUMMARY OF THE INVENTION

In view of the above-described problem provided to the conventional technology, it is an object of the invention to provide a structure of bonding a plastic part insert-molded with a wiring board capable of firmly preventing rain water or the like from invading a bonding portion and a method of bonding the same.

According to the invention, the above-described problem is resolved as follows.

(1) A first plastic part insert-molded with a wiring board continuous to a connection terminal and a second plastic part bonded with the first plastic part are provided and in insert-molding the wiring board, a surrounding of a holding hole of the wiring board provided at the first plastic part and a bonding face of the second plastic part opposed thereto are bonded to each other.

(2) A first plastic part insert-molded with a wiring board continuous to a connection terminal and a second plastic part bonded with the first plastic part and bored with a connection terminal introducing hole to which the connection terminal is introduced are provided and a surrounding of the connection terminal in the first plastic part and a surrounding of the connection terminal introducing hole in the second plastic part opposed thereto are bonded to each other.

(3) A first plastic part insert-molded with a wiring board continuous to a connection terminal and a second plastic part bonded with the first plastic part and bored with a connection terminal introducing hole to which the connection terminal is introduced are provided, in insert-molding the wiring board, a surrounding of a holding hole of the wiring board provided at the first plastic part and a bonding face of the second plastic part opposed thereto are bonded to each other and a surrounding of the connection terminal in the first plastic part and a surrounding of the connection terminal introducing hole in the second plastic part opposed thereto are bonded to each other.

(4) In any of the above-described terms of (1) through (3), the first plastic part bonded to the second plastic part is further laminated with other of the first plastic part and a surrounding of a holding hole of a wiring board of the other first plastic part and a bonding face of the first plastic part opposed thereto are bonded to each other.

(5) A method of bonding a first plastic part insert-molded with a wiring board continuous to a connection terminal and a second plastic part, wherein in insert-molding the wiring board, at either one of a surrounding of a holding hole of the wiring board provided at the first plastic part and the second plastic part opposed thereto, a hole side projected portion capable of being brought into contact with a bonding face of other thereof is provided, and the surrounding of the holding hole in the first plastic part and the second plastic part are bonded to each other by melting the hole side projected portion by applying an ultrasonic wave to bonding portions of the two plastic parts.

(6) A method of bonding a first plastic part insert-molded with a wiring board continuous to a connection terminal and a second plastic part bored with a connection terminal introducing hole to which the connection terminal is introduced, wherein at either one of a surrounding of the connection terminal in the first plastic part and a surrounding of the connection terminal introducing hole in the second plastic part opposed thereto, a connection terminal side projected portion capable of being brought into contact with a bonding face of other thereof is provided and the surrounding of the connection terminal in the first plastic part and the surrounding of the connection terminal introducing hole in the second plastic part are bonded to each other by melting the connection terminal side projected portion by applying an ultrasonic wave to bonding portions of the two plastic parts.

(7) A method of bonding a first plastic part insert-molded with a wiring board continuous to a connection terminal and a second plastic part bored with a connection terminal introducing hole to which the connection terminal is introduced, wherein in insert-molding the wiring board, at either one of a surrounding of a holding hole of the wiring board provided at the first plastic part and the second plastic part opposed thereto, a hole side projected portion capable of being brought into contact with a bonding face of other thereof is provided, further, at either one of a surrounding of the connection terminal in the first plastic part and a surrounding of the connection terminal introducing hole in the second plastic part, a connection terminal side projected portion capable of being brought into contact with a bonding face of other thereof is provided, and the surrounding of the holding hole in the first plastic part and the bonding face of the second plastic part opposed thereto are bonded to each other and the surrounding of the connection terminal in the first plastic part and the surrounding of the connection terminal introducing hole in the second plastic part are bonded to each other by melting the hole side projected portion and the connection terminal side projected portion by applying an ultrasonic wave to bonding portions of the two plastic parts.

(8) In any of the above-described items of (5) through (7), the first plastic part bonded to the second plastic part is further stacked with other of the first plastic part and a surrounding of a holding hole in the other first plastic part and the first plastic part are bonded to each other by melting a hole side projected portion provided at either one of the surrounding of the holding hole of the wiring board in the other first plastic part and the first plastic part opposed thereto by applying the ultra sonic wave to bonding portions of the two first plastic parts.

(9) In any of the above-described items of (6) and (7) or (8) dependent from the above-described items of (6) and (7), a connection terminal side projected portion is provided at the surrounding of the connection terminal in the first plastic part and constituted by a shape of a wedge capable of being brought into contact with a peripheral edge of the connection terminal introducing hole in the second plastic part.

(10) In any of the above-described items of (1) through (9), an electric wire connected to the wiring board is further insert-molded to the first plastic part.

DETAILED DESCRIPTION OF THE PREFERRED EMBODIMENTS

Figure 1:
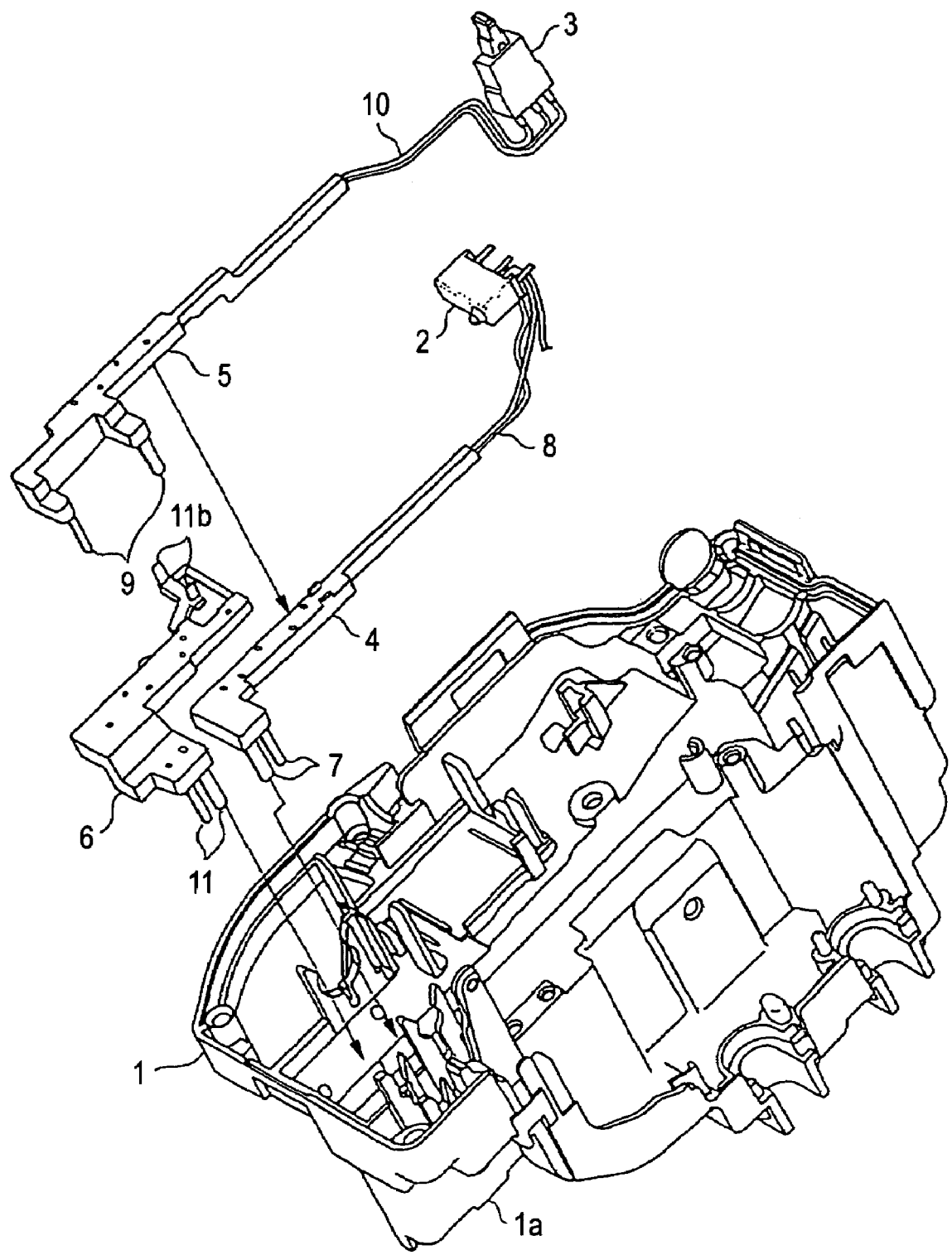
FIG. 1 is a disassembled perspective view according to an embodiment of the invention.

An embodiment of the invention will be explained in reference to the drawings as follows.

A housing (1) constituting a second plastic part is integrated to a door latch apparatus (not illustrated) mounted to inside of a vehicular door and a door portion thereof is integrally provided with a connector connecting portion (1a) in a shape of a bottomed cylinder fitted with a wire connector (not illustrated) of an outside electrical equipment of a power source, a control circuit or the like. A bottom portion (1b) of the connector connecting portion (1a) is bored with a plurality (6 pieces according to the embodiment) of connection terminal introducing holes (1c).

Figure 2:
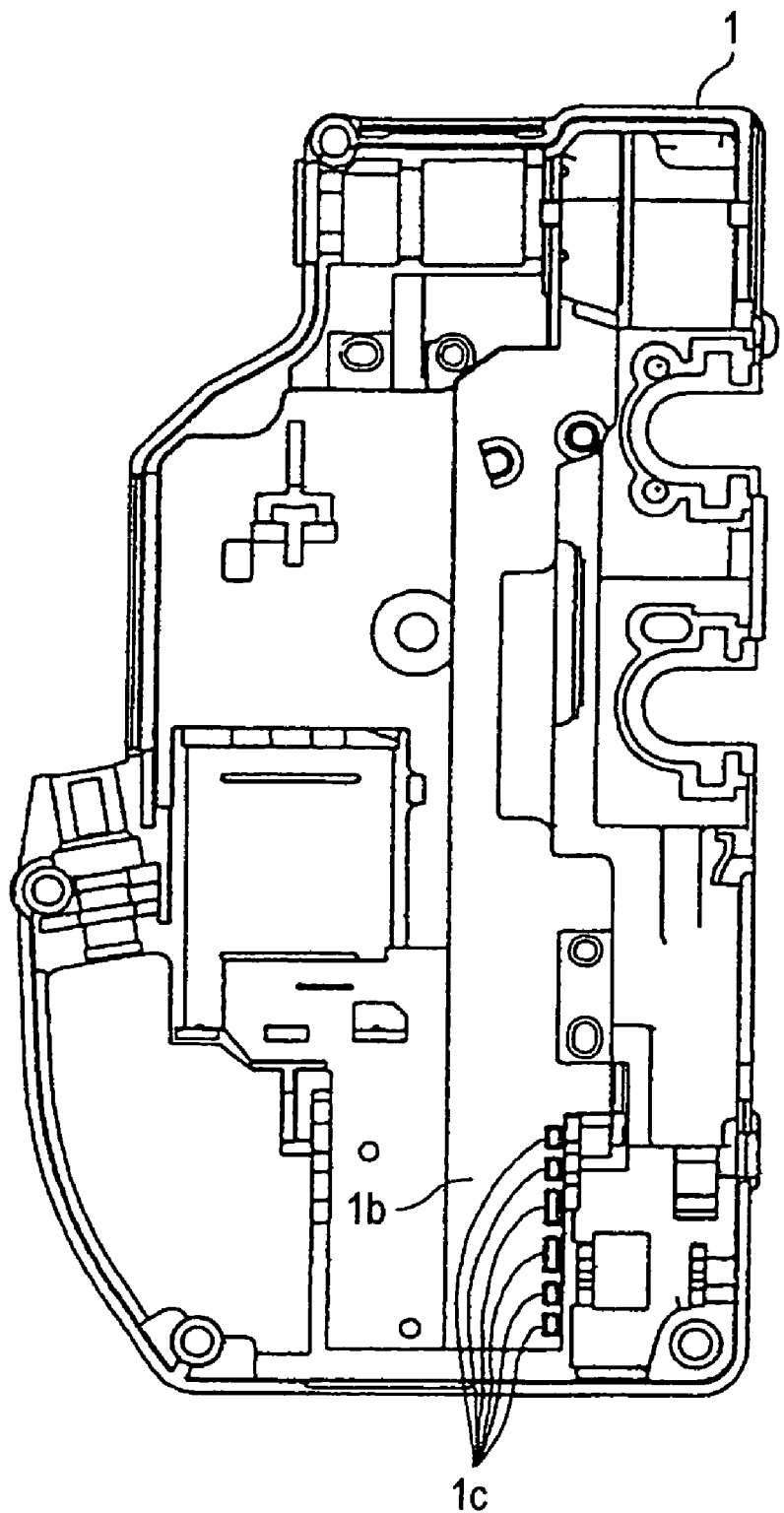
FIG. 2 is a front view of a housing of the same.

An inner face side (an upper side in FIG. 1, on this side of paper face in FIG. 2 and FIG. 3) of the housing (1) is arranged with a motor (not illustrated) for operating various levers provided at the door latch apparatus, gears and links (not illustrated) operated by the motor and first and second waterproofing limit switches (2) and (3) for detecting positions of the various levers.

Further, on the inner face side of the housing (1), a first, a second and a third terminal block (4), (5) and (6) constituting the first plastic part are respectively bonded thereto by ultrasonic welding capable of bonding plastic parts.

Figure 5:
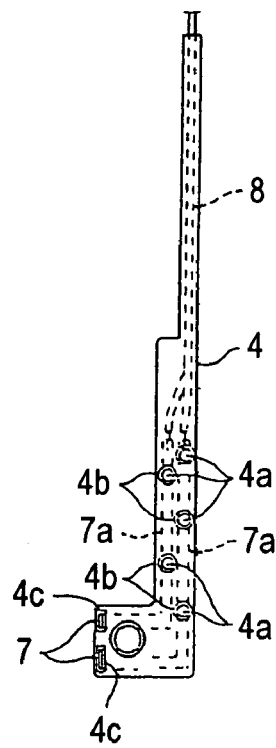
FIG. 5 is a rear view of the first terminal block.
Figure 7:
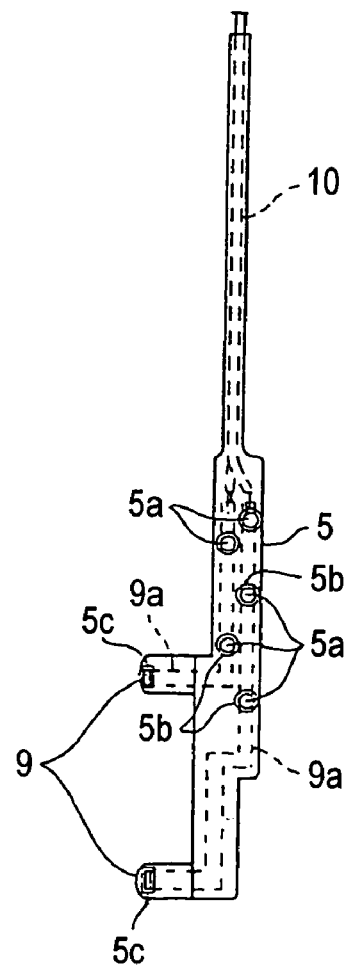
FIG. 7 is a rear view of the second terminal block.

As shown by FIG. 5 and FIG. 7, respectives of the first and the second terminal blocks (4) and (5) are insert-molded with wiring boards (7a) and (9a) continuous to two pieces of conductive connection terminals (7) and (9) projected substantially orthogonally from lower end portions thereof and introduced into the connection terminal introducing holes (1c) and electric wires (8) and (10) wired to upper ends of the wiring boards (7a) and (9a) by soldering.

The electric wire (8) emerging from an upper end of the first terminal block (4) is wired with an electric terminal of the first limit switch (2), further, the electric wire (10) emerging from an upper end of the second terminal block (5) is wired with an electric terminal of the second limit switch (3).

Figure 6:
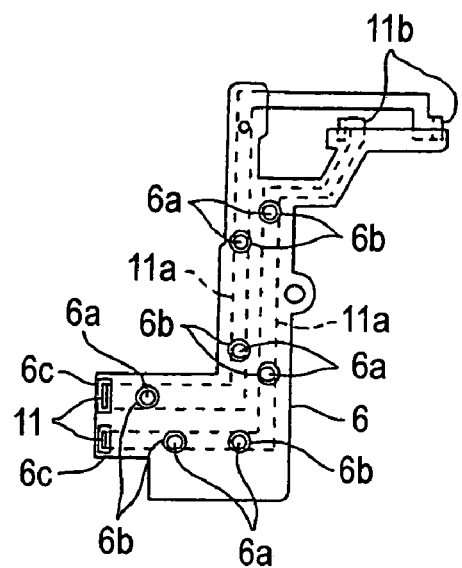
FIG. 6 is a rear view of the third terminal block.

As shown by FIG. 6, the third terminal block (6) is insert-molded with a wiring board (11a) continuous to a connection terminal (11) introduced into the connection terminal introducing hole (1c). A connection plate (11b) connected to an electric terminal of the motor emerges from an upper end portion of the third terminal block (6).

As shown mainly by FIG. 5 through FIG. 7, bonding faces of the respective terminal blocks (4), (5) and (6) (on this side of paper face in FIG. 4 through FIG. 7) are respectively provided with pluralities of holding holes (4a), (5a) and (6a) formed for holding the wiring boards (7a), (9a) and (11a) at a space of a die in insert-molding the wiring boards (7a), (9a) and (11a) and respectively projected with hole side projected portion (4b), (5b) and (6b) in a shape of a circular ring at surroundings of the respective holding holes (4a), (5a) and (6a) and connection terminal side projected portions (4c), (5c) and (6c) in a shape of a wedge capable of being brought into contact with peripheral edges of the connection terminal introducing holes (1c) at surroundings of the connection terminals (7), (9) and (11).

The respective hole side projected portions (4b), (5b) and (6b) and the respective connection terminal side projected portions (4c), (5c) and (6c) are for enabling to convert oscillation energy applied to the plastic part efficiently into thermal energy in bonding the plastic parts by ultrasonic welding.

Figure 9:
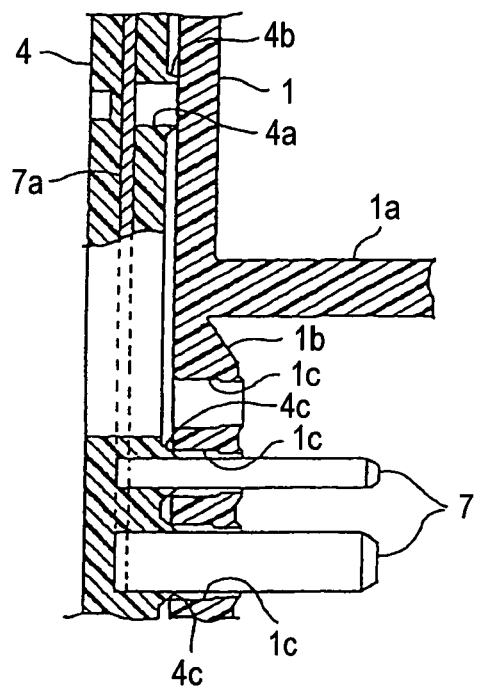
FIG. 9 is a vertical sectional view enlarging an essential portion in a state of tacking the first terminal block to the housing.

As shown by FIG. 9, the first terminal block (4) is tacked to a predetermined position of the housing (1) in a state in which first, the hole side projected portion (4b) of the first terminal block (4) is brought into contact with a bonding face of the housing (1) and the connection terminal (7) is introduced to the corresponding connection terminal introducing hole (1c) to thereby bring the connection terminal side projected portion (4c) in the shape of the wedge into contact with the peripheral edge of the connection terminal introducing hole (1c). Thereby, the first terminal block (4) can accurately be tacked to the housing (1).

Figure 10:
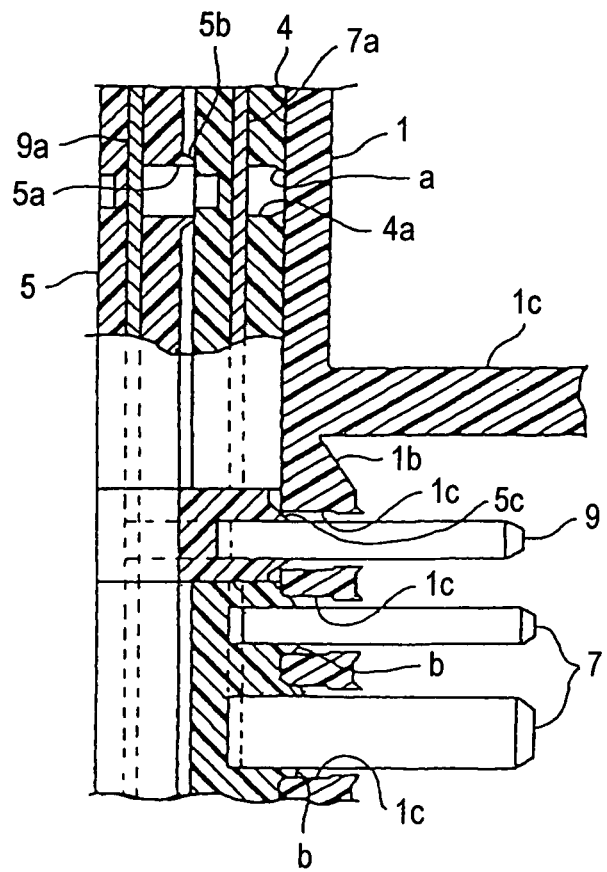
FIG. 10 is a sectional view enlarging a portion the same as that of FIG. 9 in a state of tacking the second terminal block to the first terminal block welded to the housing.
Figure 11:
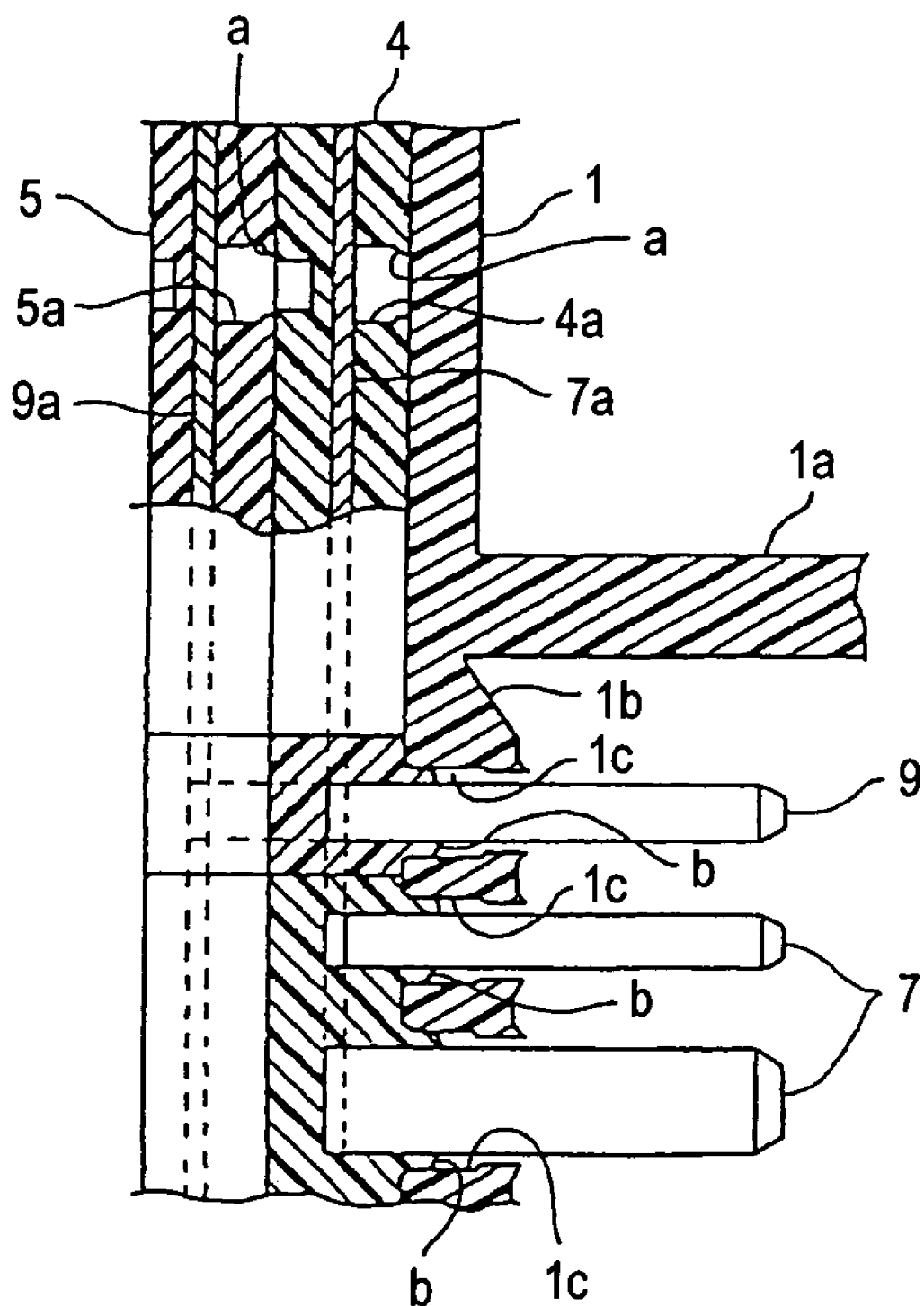
FIG. 11 is a vertical sectional view enlarging the portion the same as that of FIG. 9 in a state of bonding the first and the second terminal blocks.

Further, as shown by FIG. 10 and FIG. 11, by applying ultrasonic wave to portions of the housing (1) and the first terminal block (4) for bonding under the state, the hole side projected portion (4b) is melted and the surrounding of the holding hole (4a) is bonded to the bonding face of the housing (1) and the connection terminal side projected portion (4c) is melted and the surrounding of the root portion of the connection terminal (7) is bonded to the surrounding of the connection terminal introducing hole (1c) of the housing (1), respectively.

As mainly shown by FIG. 10, in carrying out the ultrasonic welding, a plastic material (a) forming the melted hole side projected portion (4b) flows to the holding hole (4a) and a plastic material (b) forming the melted connection terminal side projected portion (4c) flows to a clearance between the connection terminal (7) and the connection terminal introducing hole (1c).

As described above, by bonding the surrounding of the holding hole (4a) in the first terminal block (4) to the housing (1), it can firmly be hampered that rain water or the like invades a clearance between the bonding faces of the housing (1) and the first terminal block (4) and the rain water or the like invades the holding hole (4a) and adhered to the wiring board (7a).

Further, by making the plastic material (a) forming the melted hole side projected portion (4b) flow to the holding hole (4a) and the plastic material (b) forming the melted connection terminal side projected portion (4c) flow to the clearance between the connection terminal (7) and the connection terminal introducing hole (1c), in welding the plastic parts by ultrasonic wave, there can be prevented occurrence of so-to-speak "flush" phenomenon in which the plastic material jumps out of the bonding faces of the plastic parts bonded to each other by pressure of a welding horn in an ultrasonic welder and the first terminal block (4) can accurately be bonded to the housing (1).

Further, by making the plastic material (b) forming the melted connection terminal side projected portion (4c) flow to the clearance between the connection terminal (7) and the connection terminal introducing hole (1c), occurrence of the "flush" phenomenon is prevented, the clearance of the connection terminal introducing hole (1c) inserted with the connection terminal (7) is completely closed and rain water can firmly be prevented from invading from the connection terminal introducing hole (1c).

Figure 3:
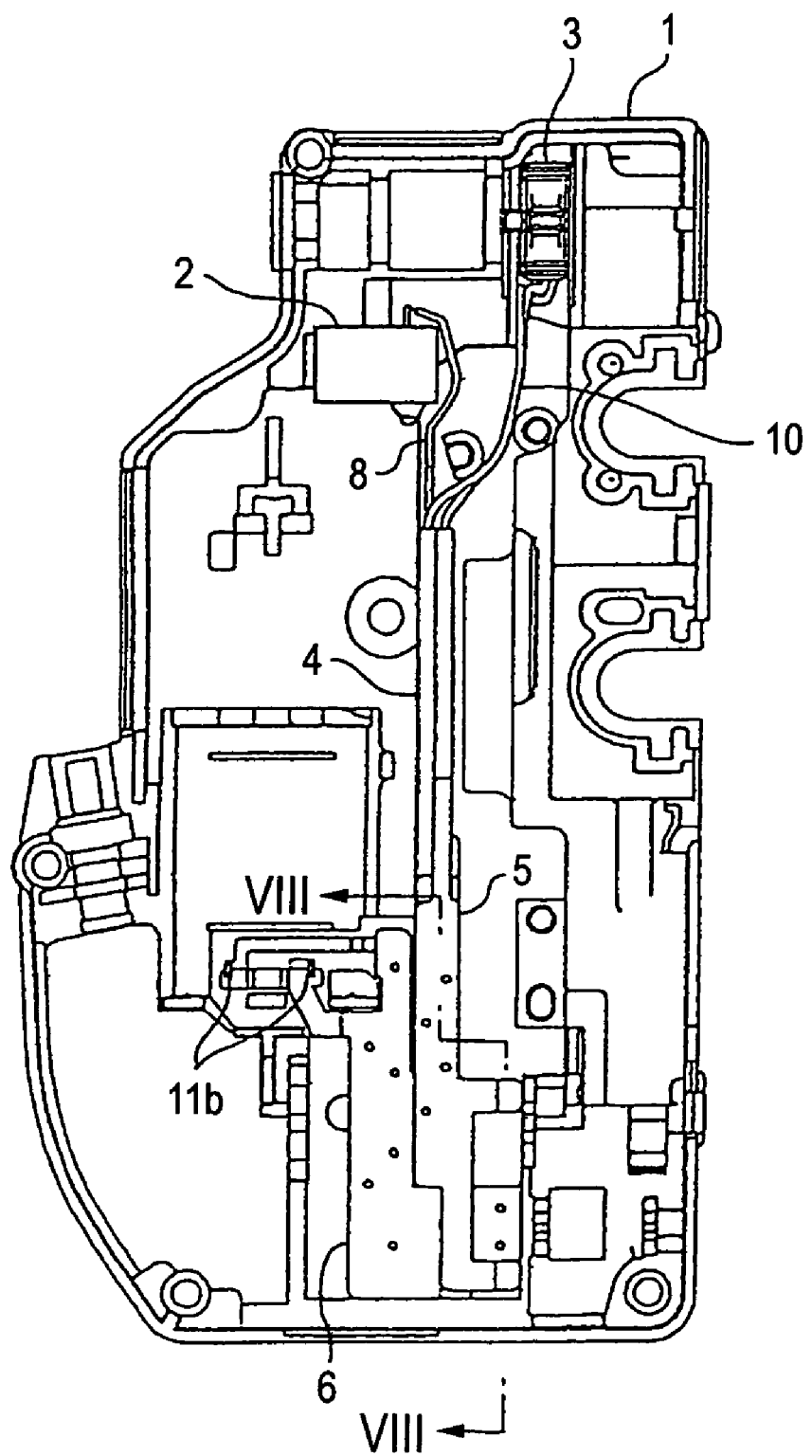
FIG. 3 is a front view of the housing in a state in which a first, a second and a third terminal block are integrated to the predetermined positions.
Figure 4:
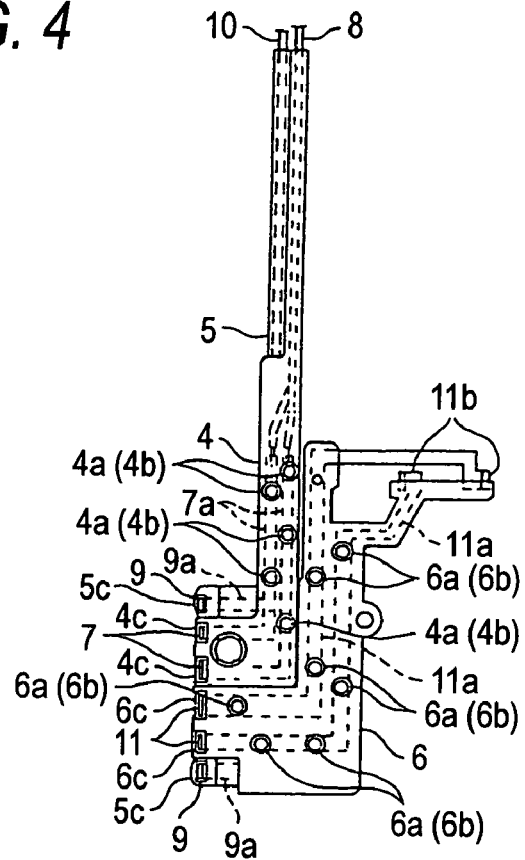
FIG. 4 is a rear view of a state of integrating the first, the second and the third terminal block.

As shown by FIG. 3, the third terminal block (6) is bonded to the housing (1) by ultrasonic welding in a state of being tacked to the left side of the first terminal block (4). Thereby, also in the third terminal block (6) similar to the first terminal block (4), respective surroundings of the holding hole (6a) and the connection terminal (11) are bonded to the housing (1).

As shown by FIG. 10, after bonding the first and the third terminal blocks (4) and (6) to the housing (1) by ultrasonic welding, the second terminal block (5) is stacked to the first terminal block (4), the hole side projected portion (5b) is brought into contact with a bonding face of the first terminal block (a face on a side opposed to the face formed with the holding hole (4a)), the connection terminal (9) is inserted into the corresponding connection terminal introducing hole (1c) and the second terminal block (5) is tacked to a predetermined position of the housing (1) in a state in which the connection terminal side projected portion (5c) is brought into contact with the peripheral edge of the connection terminal introducing hole (1c).

Figure 8:
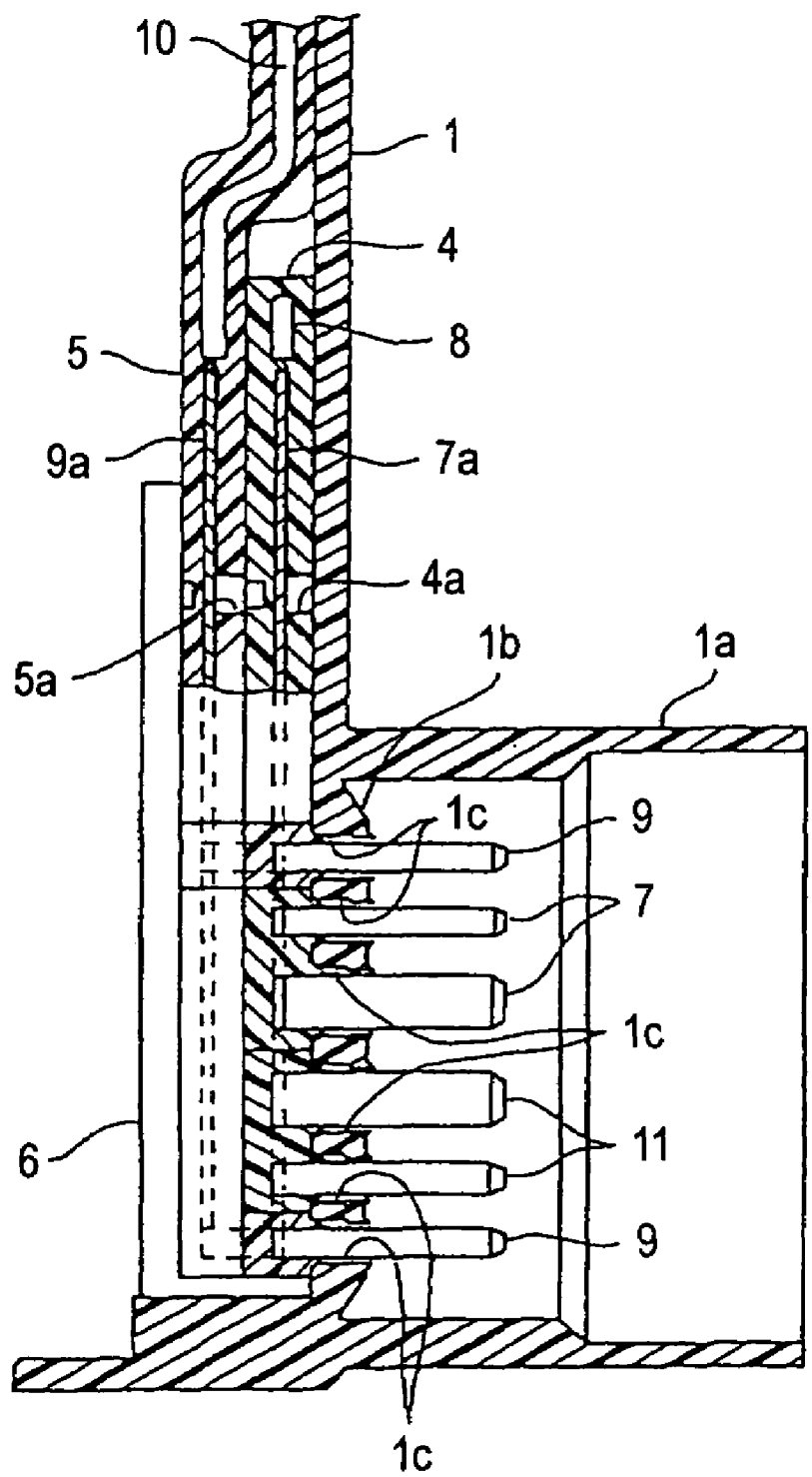
FIG. 8 is a vertical sectional view taken along a line VIII—VIII in FIG. 3.

Further, by applying ultrasonic wave to the bonding portions of the first terminal block (4) bonded to the housing (1) and the second terminal block (5) under the state, as shown by FIG. 8 and FIG. 11, the two projected portions (5b) and (5c) are melted and the surrounding of the holding hole (5a) and the surrounding of each connection terminal (9) are respectively bonded to the housing (1).

Thereby, a plurality of the respective terminal blocks (4), (5) and (6) can efficiently be arranged to a small space, in the second terminal block (5) stacked to the first terminal block (4), similar to the first terminal block (4), by bonding the surroundings of the holding hole (5a) and the connection terminal (9), it can firmly be prevented that rain water is adhered to the wiring board (9a) and rain water invades from the connection terminal introducing hole (1c) inserted with the connection terminal (9), the "flush" phenomenon is prevented from being brought about and the second terminal (5) can accurately be bonded to the first terminal block (5).

Further, although according to the above-described embodiment, after bonding the first terminal block (4) to the housing (1), the second terminal block (5) is stacked to the first terminal block (4) to bond, instead thereof, prior to bonding the first terminal block (4) to the housing (1), the second terminal block (5) may be bonded to the first terminal block (4) by ultrasonic welding and thereafter, the first terminal block (4) may be bonded to the housing (1) by ultrasonic welding.

Further, the invention is not specified to the above-described embodiment but the embodiment can be modified or changed within a range not deviated from the gist of the invention as follows.

(i) The hole side projected portions (4b) and (6b) are provided at the bonding face of the housing (1) opposed to the surroundings of the holding holes (4a) and (6a) provided at the first and the third terminal blocks (4) and (6).

(ii) The hole side projected portion (5b) is provided at the bonding face of the first terminal block (4) opposed to the surrounding of the holding hole (5a) provided at the second terminal block (5).

(iii) The connection terminal side projected portions (4c), (5c) and (6c) are provided at the surroundings of the connection terminal introducing holes (1c) in the housing (1).

(iv) The surroundings of the holding holes (4a) and (6a) and the surroundings of the connection terminals (7) and (11) in the first and the third terminal blocks (4) and (6) are respectively bonded to the housing (1) by an adhering agent without providing the hole side projected portions (4b) and (6b) and the connection terminal side projected portions (4c) and (6c) in the first and the third terminal blocks (4) and (6).

(v) The surrounding of the holding hole (5a) and the surrounding of the connection terminal (9) in the second terminal block (5) are respectively bonded to the housing (1) by an adhering agent without providing the whole side projected portion (5b) and the connection terminal side projected portion (5c) in the second terminal block (5).

According to the invention, the following effect can be achieved.

(a) According to the first aspect of the invention, the surrounding of the holding hole in the first plastic part is bonded to the bonding face of the second plastic part to thereby close the holding hole and therefore, it can firmly be prevented that rain water or the like invades the holding hole and is adhered to the wiring board.

(b) According to the second aspect of the invention, the surrounding of the connection terminal in the first plastic part is bonded to the surrounding of the connection terminal introducing hole of the second plastic part to thereby close the clearance of the connection terminal introducing hole in the second plastic part therefore, it can firmly be prevented that rainwater or the like invades inside of the second plastic part from the clearance between the connection terminal and the connection terminal introducing hole.

(c) According to the third aspect of the invention, the effects of both the first and second aspects of the invention can be achieved.

(d) According to the fourth aspect of the invention, in addition to the above effects of the invention, the plurality of the first plastic part can efficiently be arranged to a small space.

(e) According to the fifth aspect of the invention, the surrounding of the holding hole in the first plastic part is bonded to the bonding face of the second plastic part to close the holding hole and therefore, it can firmly be prevented that rain water or the like invades the holding hole to be adhered to the wiring board and since in ultrasonic welding, the plastic material forming the melted hole side projected portion flows to the holding hole, the first plastic part can accurately be bonded to the second plastic part by preventing the "flush" phenomenon in the ultrasonic welding.

(f) According to the sixth aspect of the invention, in ultrasonic welding, the plastic material forming the melted connection terminal side projected portion flows to the clearance between the connection terminal and the connection terminal introducing hole and therefore, the clearance of the connection terminal introducing hole in the second plastic part is closed, it can firmly be prevented that rain water or the like invades inside of the second plastic part from the clearance between the connection terminal and the connection terminal introducing hole and the first plastic part can accurately be bonded to the second plastic part by preventing the "flush" phenomenon in the ultrasonic welding.

(g) According to the seventh aspect of the invention, the effects as described above (e) and (f) can be achieved.

(h) According to the eighth aspect of the invention, in addition to the effects of the invention of (e) through (g), in ultrasonic welding, the plastic material forming the melted hole side projected portion flows to the holding hole and therefore, a plurality of the first plastic parts can accurately be bonded in a state of being stacked to each other by preventing "flush" phenomenon in ultrasonic welding.

(i) According to the ninth aspect of the invention, in addition to the effects of (f) through (h), the first plastic part can accurately be bonded to the second plastic part and the clearance between the connection terminal and the connection terminal introducing hole can further firmly be closed.

(f) According to the tenth aspect of the invention, in addition to the above-described effects of the invention, the electric wire can be wired to the second plastic part simply and firmly.

What is claimed is:

1. A bonding structure of plastic parts, comprising:
 a first plastic part comprising an insert-molded wiring board at least partially surrounded by plastic and at least one wiring board holding hole extending through the plastic that at least partially surrounds the wiring board, wherein the wiring board is connected to a connection terminal;
 a second plastic part comprising a bonding face;
 wherein excess plastic material selectively located in an area surrounding said at least one holding hole is bonded to the bonding face of the second plastic part.

2. The bonding structure according to claim 1, wherein said bonding structure further comprises a third plastic part comprising an insert-molded wiring board, said third plastic part comprising at least one wiring board holding hole, and
 wherein excess plastic material surrounding said at least one holding hole of said third plastic part and a bonding face of said first plastic part opposed to said at least one holding hole of said third plastic part are bonded to each other so that said third plastic part is stacked to said first plastic part.

3. The boding structure according to claim 1, wherein an electric wire connected to the wiring board is further insert-molded to the first plastic part.

4. The bonding structure according to claim 1, wherein said surrounding of said holding hole is ring-shaped.

5. A door latch component for a vehicle, comprising:
 a door latch component comprising a plastic bonding member;
 wherein the plastic bonding member comprises a bonding structure as defined in claim 1.

6. The bonding structure according to claim 1, wherein said plastic material selectively located in an area surrounding said holding hole is raised from a bonding face of the first plastic part.

7. A bonding structure of plastic parts, comprising:
 a first plastic part comprising an insert-molded wiring board at least partially surrounded by plastic, wherein the wiring board is connected to a connection terminal; and
 a second plastic part comprising a terminal introducing hole in which said connection terminal is introduced;
 wherein excess plastic material selectively located in an area surrounding said connection terminal said terminal introducing hole are bonded to each other.

8. The bonding structure according to claim 7, wherein said bonding structure further comprises a third plastic part comprising an insert-molded wiring board, said third plastic part comprising at least one wiring board holding hole, and
 wherein excess plastic material surrounding said at least one holding hole of said third plastic part and a bonding face of said first plastic part opposed to said at least one holding hole of said third plastic part are bonded to each other so that said third plastic part is stacked to said first plastic part.

9. The bonding structure according to claim 7, wherein said surrounding of said connection terminal is wedge-shaped.

10. A bonding structure of plastic parts, comprising:
 a first plastic part comprising an insert-molded wiring board at least partially surrounded by plastic and at least one wiring board holding hole extending through the plastic that at least partially surrounds the wiring board, wherein the wiring board is connected to a connection terminal; and
 a second plastic part comprising a bonding face and a terminal introducing hole in which said connection terminal is introduced;
 wherein excess plastic material selectively located in an area surrounding said at least one holding hole is bonded to the bonding face of the second plastic part,
 wherein excess plastic material selectively located in an area surrounding said connection terminal said terminal introducing hole are bonded to each other.

11. The bonding structure according to claim 10, wherein said bonding structure further comprises a third plastic part comprising an insert-molded wiring board, said third plastic part comprising at least one wiring board holding hole, and
 wherein excess plastic material surrounding said at least one holding hole of said third plastic part and a bonding face of said first plastic part opposed to said at least one holding hole of said third plastic part are bonded to each other so that said third plastic part is stacked to said first plastic part.

12. The bonding structure according to claim 10, wherein said surrounding of said holding hole is ring-shaped.

13. The bonding structure according to claim 10, wherein said surrounding of said connection terminal is wedge-shaped.

* * * * *